United States Patent [19]
Spak et al.

[11] Patent Number: 4,813,015
[45] Date of Patent: Mar. 14, 1989

[54] FRACTURABLE X-Y STORAGE ARRAY USING A RAM CELL WITH BIDIRECTIONAL SHIFT

[75] Inventors: Michael E. Spak, Kyle; Craig S. Tyl; Philip C. Wottrich, both of Austin, all of Tex.

[73] Assignee: Advanced Micro Devices, Inc., Sunnyvale, Calif.

[21] Appl. No.: 838,993

[22] Filed: Mar. 12, 1986

[51] Int. Cl.$^4$ .................. G11C 19/00; G11C 7/00; G11C 8/00

[52] U.S. Cl. .................................. 365/78; 365/221; 365/189; 365/240

[58] Field of Search .............. 365/220, 221, 78, 189, 365/230, 233, 239, 240, 238; 307/481; 377/28

[56] References Cited

U.S. PATENT DOCUMENTS

| | | | |
|---|---|---|---|
| 3,942,163 | 3/1976 | Goyal | 365/78 |
| 3,975,717 | 8/1976 | Panigrahi | 365/78 |
| 4,521,874 | 6/1985 | Rau et al. | 365/221 X |
| 4,553,203 | 11/1985 | Rau et al. | 364/200 X |
| 4,633,440 | 12/1986 | Pakulski | 365/189 X |
| 4,660,217 | 4/1987 | Yamada | 365/78 |
| 4,674,032 | 6/1987 | Michaelson | 364/900 |

FOREIGN PATENT DOCUMENTS

| | | | |
|---|---|---|---|
| 53-63935 | 6/1978 | Japan | 365/240 |
| 61-184781 | 8/1986 | Japan | 365/78 |
| 2035637 | 6/1980 | United Kingdom | 365/78 |

OTHER PUBLICATIONS

IBM Technical Disclosure Bulletin, vol. 26, No. 12, May 84, pp. 6341–6343, "Universal Shifter", by S. Barret.

Primary Examiner—Stuart N. Hecker
Assistant Examiner—Alfonso Garcia
Attorney, Agent, or Firm—Davis Chin

[57] ABSTRACT

A fracturable x-y random access memory array for performing pushing and popping of data and fracturing the array simultaneously at a common address includes a row fracture circuit responsive to row addresses to fracture the array in the Y-direction and a column fracture circuit responsive to column addresses for fracturing the array in the X-direction. A plurality of memory cells are stacked in a plurality of columns to form an x-y organization which can be randomly accessed in response to the row and column addresses. The memory cells are responsive to a shift control driver circuit for bidirectional shifting of data by either pushing data into or popping data from at any point within one of the plurality of randomly addressable column at the same row and column addresses used to fracture the array defining a fracture point. Data in all of the memory cells in the array with addresses higher (or lower) than the fracture point shift and the memory cells with addresses lower (or higher) than the fracture point maintain their data unchanged.

5 Claims, 11 Drawing Sheets

FRACTURABLE X-Y STORAGE ARRAY USING A RAM CELL WITH BIDIRECTIONAL SHIFT

BACKGROUND OF THE INVENTION

This invention relates generally to random access memory circuits and more particularly, it relates to a fracturable x-y random access memory (RAM) array which performs simultaneously random access of data and random fracturing of the array by utilizing a common address.

Specifically, the present invention is directed to improvements in a random access memory which includes a plurality of static cross-coupled memory cells arranged in an x-y array organization which performs pushing of data into a stack and popping of data from a stack as well as providing random, read/write access to the memory cells. In addition, there is provided a memory cell form of a pair of cross-coupled latches which includes means for controlling the direction of shifting in a bidirectional shift. A plurality of such memory cells may be arranged in a column for use as a master-slave shift register wherein data is insertable/delectable in the middle of the shift register.

Ordinarily a computer of any size, whether it is a main frame, a minicomputer or a microcomputer, will require the use serial memory storage devices or shift registers. These shift registers consist typically of ordered circuit arrays which provide a higher circuit density than non-ordered configurations. The large volume production of such shift registers lowers dramatically the cost per equivalent gate. A new data word is insertable at a selected address in a shift register, and a stored data word is readable (deletable) from a selected address. Upon data word insertion (pushing), all subsequent data below the selected address is shifted or pushed down one address. Upon data word deletion (popping), all subsequent data below the selected address is shifted or popped up one address.

However, in the prior art shifted registers the shifting of data occurred only in one direction (unidirectional). In addition, these prior shift registers lose its random access capability typical of addressable random access memories. Further, for any sizeable shift register the switching current required to shift the data becomes relatively large. There is shown a typical one-bit storage cell 120 formed of a master section 122 and a slave section 124 of such a prior art shift register in FIG. 1 of the drawings.

Accordingly, it would be desirable to provide a plurality of cross-coupled random access memory cells arranged in an x-y array which performs bidirectional shifting without causing high switching current and operates in the same manner as a conventional read/write RAM. Further, it is also expedient that the pushing and popping of data be performed on the memory array at the same bit address that is used to "fracture" the array. The term "fracture" as used herein is defined as splitting the array at a unique address such that all memory cells in the array which addresses higher (or lower) than the fracture address shift and the addresses lower (or higher) than the fracture address maintain their data unchanged. It would also be desirable to provide a memory cell formed of a pair of cross-coupled latches which includes means for controlling the direction of shifting in a bidirectional shift.

SUMMARY OF THE INVENTION

Accordingly, it is a general object of the present invention to provide a fracturable x-y random access memory access for pushing and popping data at the same address, but yet overcome the disadvantages of the prior art.

It is an object of the present invention to provide an x-y random access memroy array which is fracturable simultaneously using the same address that is used to pop and push data from/into the array.

It is another object of the present invention to provide a memory cell formed of a pair of cross-coupled latches which includes means for controlling the direction of shifting in a bidirectional shift.

It is still another object of the present invention to provide a memory cell formed of a master latch and a slave latch which includes means for switching on and off power to the master latch and the slave latch in order to control the direction of shifting as well as to reduce power consumption.

It is yet another object of the present invention to provide a memory device formed of a plurality of cross-coupled random access memory cells which are arranged in a set of addressable columns for use as a master/slave shift register wherein popping and pushing of data occurs anywhere within the shift register.

In accordance with these aims and objectives the present invention is concerned with the provision of a fracturable x-y random access memory array for performing pushing and popping of data at the same byte address which is used to fracture the array which includes a row decoder circuit responsive to row addresses for generating decoded row select signals and a column decoder circuit responsive to column addresses for generating decoded column select signals. The memory array includes a row fracture circuit responsive to the decoded row select signals for generating row shift enable signals to fracture the array in the Y-direction and a column fracture circuit responsive to the decoded column select signals for generating column shift enable signals to fracture the array in the X-direction. Shift control drivers are responsive to the row and column shift enable signals and timing phase signals for generating up-shift and down-shift pulses. A plurality of memory cells are stacked in a plurality of columns to form an x-y organization which can be randomly accessed and fractured simultaneously in response to the row and column addresses defining a fracture address. Each of the memory cells having an address higher than the fracture address are responsive to the up-shift and down-shift pulses for either pushing or popping data at any point within one of said plurality of randomly addressable stacked columns. All of the memory cells having an address lower than the fracture address maintain their data unchanged.

In another aspect of the present invention, there is provided a memory cell which includes a cross-coupled master latch and a cross-coupled slave latch. The memory cell includes means for switching on and off power supplies connected to the master latch and the slave latch so as to control the direction of shift in a bidirectional shift. Data is shifted in a first direction when the power supply connected to the master latch is switched off, and data is shifted in a second direction when the power supply connected to the slave latch is switched off.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
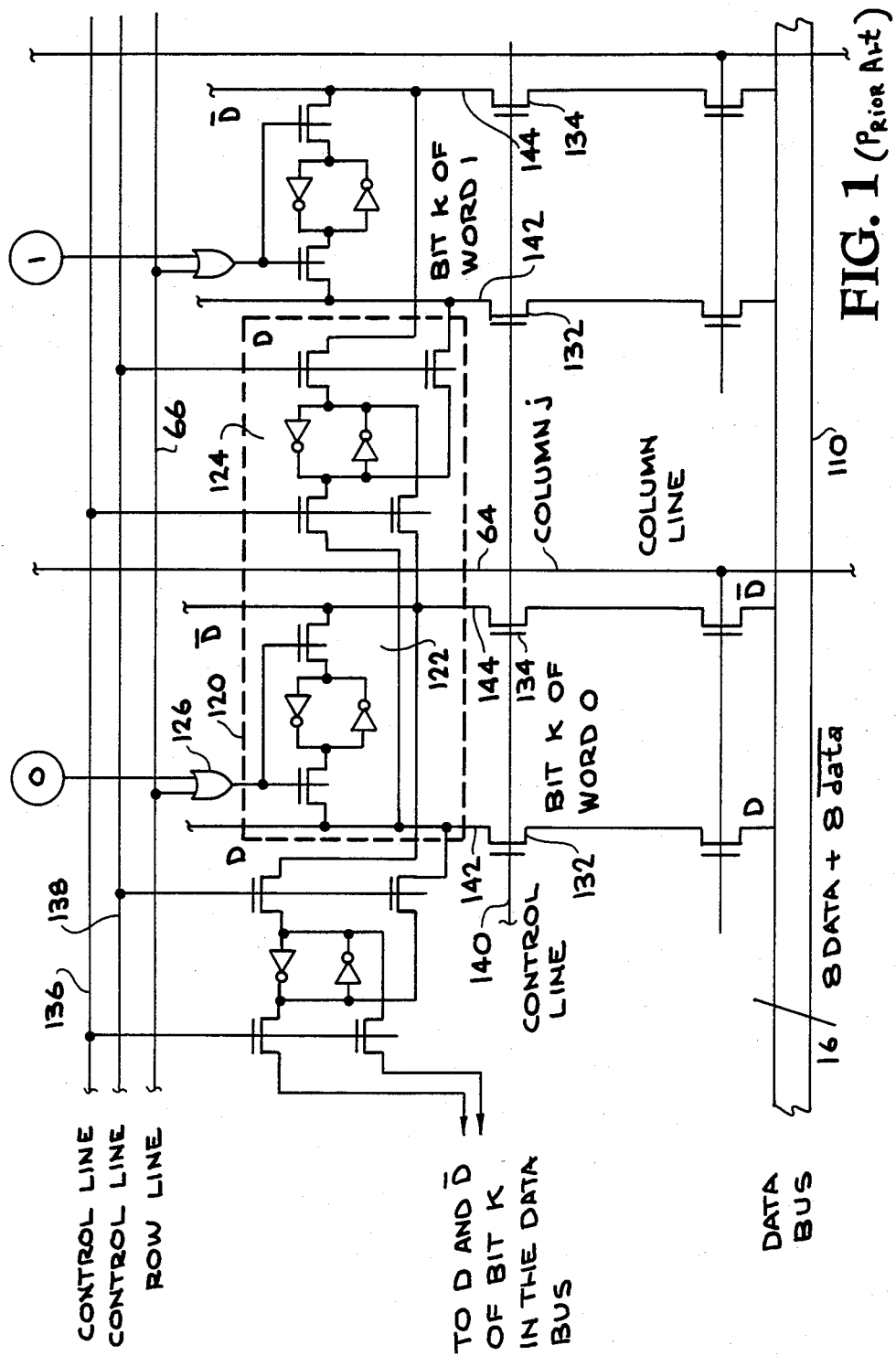
FIG. 1 is a typical one-bit storage cell formed of a master section and a slave section of a prior art shift register.
Figure 2:
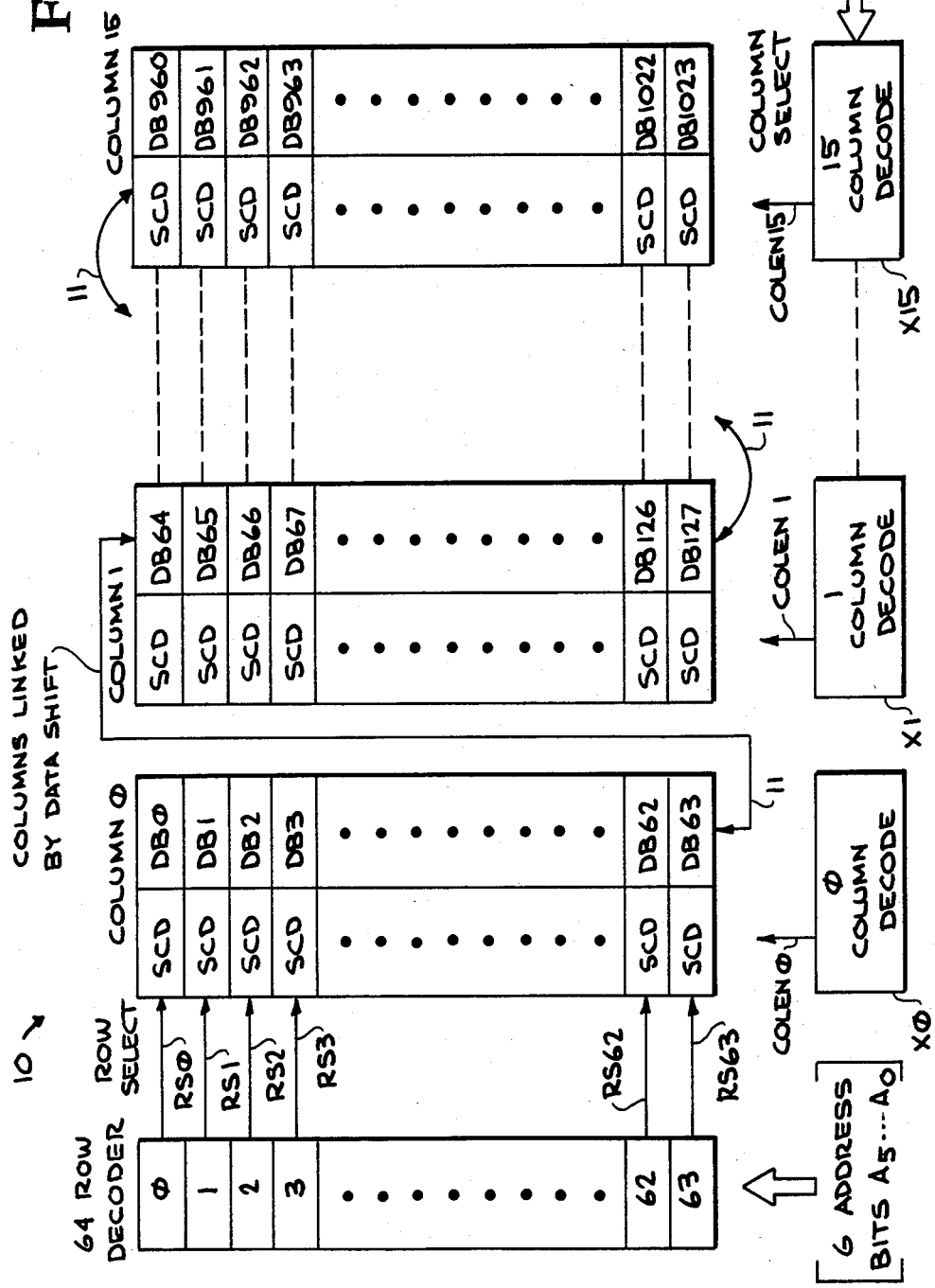
FIG. 2 is a simplified diagrammatical representation of a random access memory of the present invention.

Referring now in detail to the various drawings, there is shown in FIG. 2 a diagrammatical representation of a random access memory (RAM) 10 of the present invention in a generalized form. The RAM 10 is a hardware stack having a capacity of 1024 data bytes or words designated as storage elements DB0 through DB1023, each storage element being formed of either one-bit storage cells. For purpose of explanation, each eight-bit word or data byte is arranged in a horizontal row. Thus, the RAM 10 provides a total storage of 8192 bits.

The memory 10 is folded over into sixteen separate columns C0, C1, ... C15 in which each column contains sixty-four rows of data bytes. This defines an x-y array organization wherein the matrix includes sixty-four rows (Y=64) and sixteen columns (X=16) so as to store the 1024 data bytes. A row or Y-decoder is situated along the Y-axis of the memory array. The Y-decoder receives as its input a six-bit address A5, A4, ... A0 and provides as outputs an active signal on one of the sixty-four row select lines RS0, RS1, ... RS63 for selecting a particular row of data bytes. A plurality of column or X-decoders X0, X1, ... X15 are situated along the X-axis of the memory array. Each of the X-decoders receives as its input a four-bit address A9, A8, ... A6 and provides as outputs an active signal on appropriate ones of column enable lines COLEN0, COLEN1, ... COLEN15 when a particular column of data bytes is selected.

In the case where there are no column decoders (i.e., no x-y array is used) this situation would require 1024 row decoders. In the instant invention with an x-y matrix organiation, there are required only sixty-four row decoders (with a six-bit address being decoded) and sixteen column decoders (with a four-bit address being decoded). The intersection of the decoded row address and the decoded column address yields a particular byte of storage element to be accessed. Therefore, there is saved a considerable amount of peripheral decoder circuitry by addressing data in the array form. However, there are still required 1024 separate shift control drivers SCD with one driver for each data byte. Further, all of the sixteen columns are linked or chained together by data shift lines 11. These shift control drives SCD must be "fracturable" such that those drivers below a fracture point (i.e., addresses lower than the decoded row and column addresses) are disabled and those drivers above the fracture point (i.e., addresses higher than the decoded row and column addresses) are enabled, thereby permitting data insertion (pushing) and data deletion (popping) operations to be performed anywhere within one of the randomly addressable sixteen column stacks.

For data insertion operation, new data is written into the stack at the fracture point and all subsequent data with addresses above the fracture point are pushed or shifted down one address to the next higher numbered adddress. For the data deletion operation, existing data is read from the stack at the fracture point and all subsequent data with addresses above the fracture point are popped or shifted up one address to the next lower numbered address. It should be noted that all data with addresses below the fracture point will remain unchanged during the pushing and popping operations. Consequently, all of the drivers above the fracture point must be capable of performing a bidirectional shift in order to accommodate the pushing or popping operation.

Figure 3A:
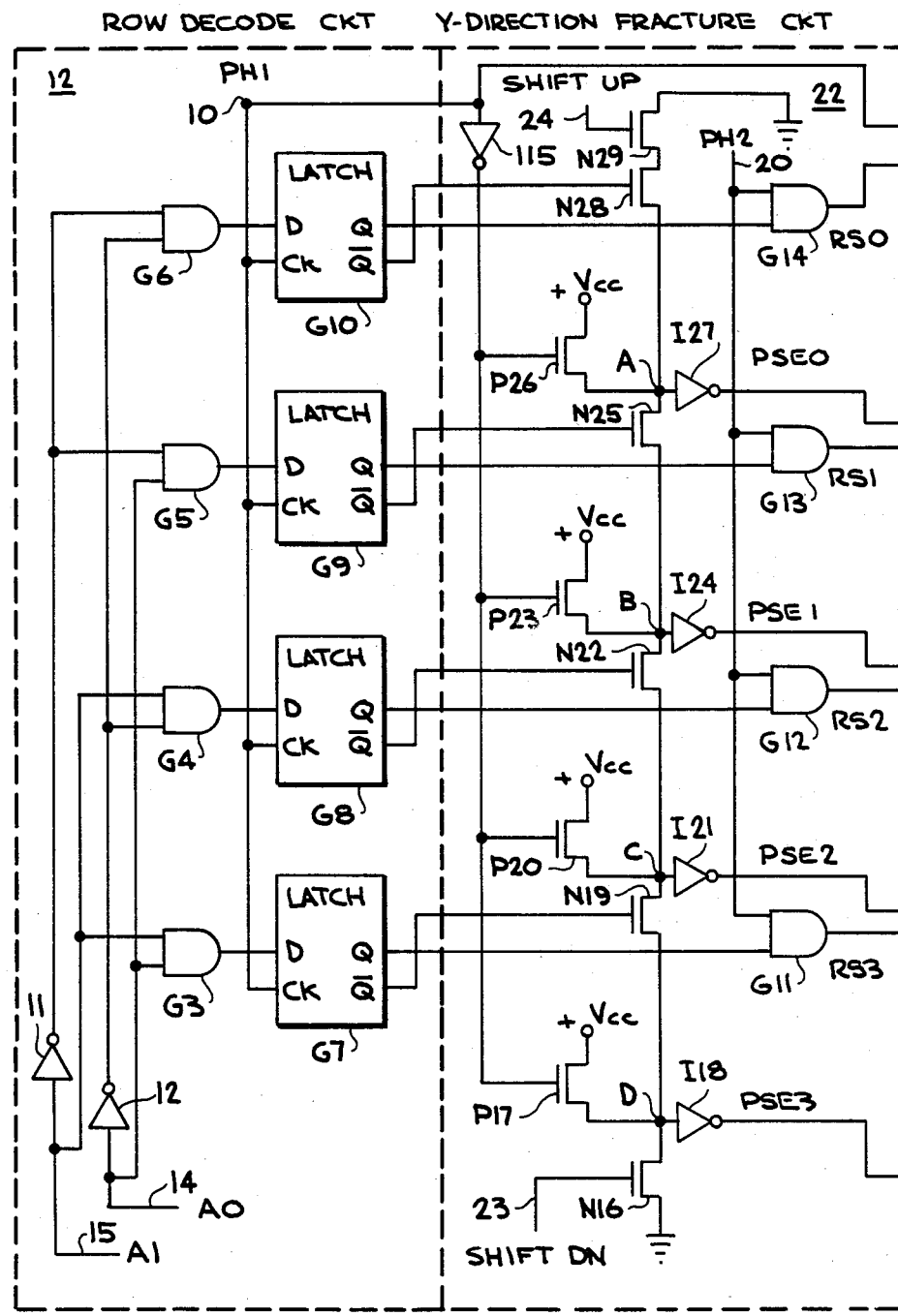
FIG. 3 is a logic diagram of a random access memory constructed in accordance with the present invention illustrating four row and two columns.
Figure 3B:
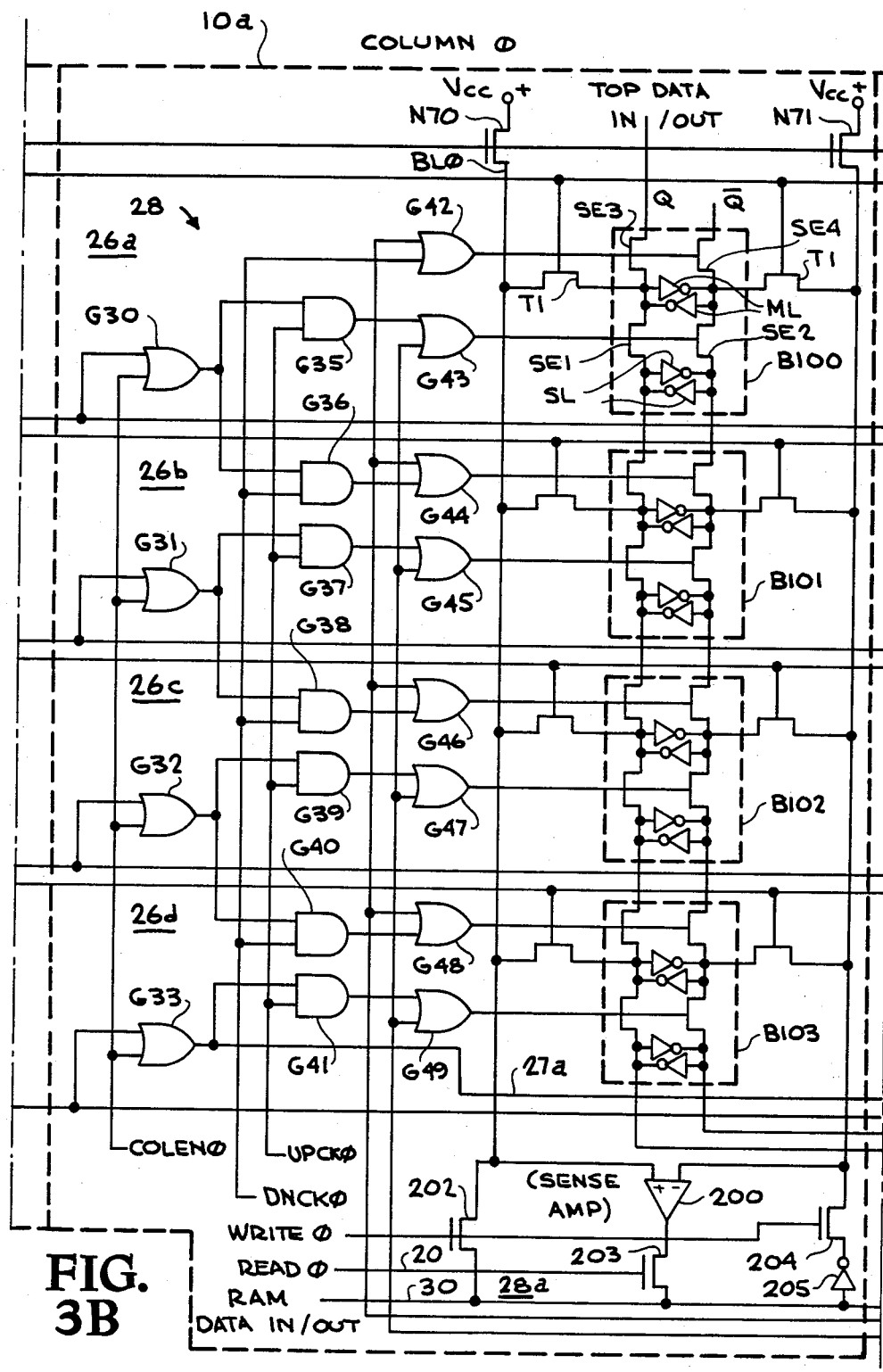
Figure 3C:
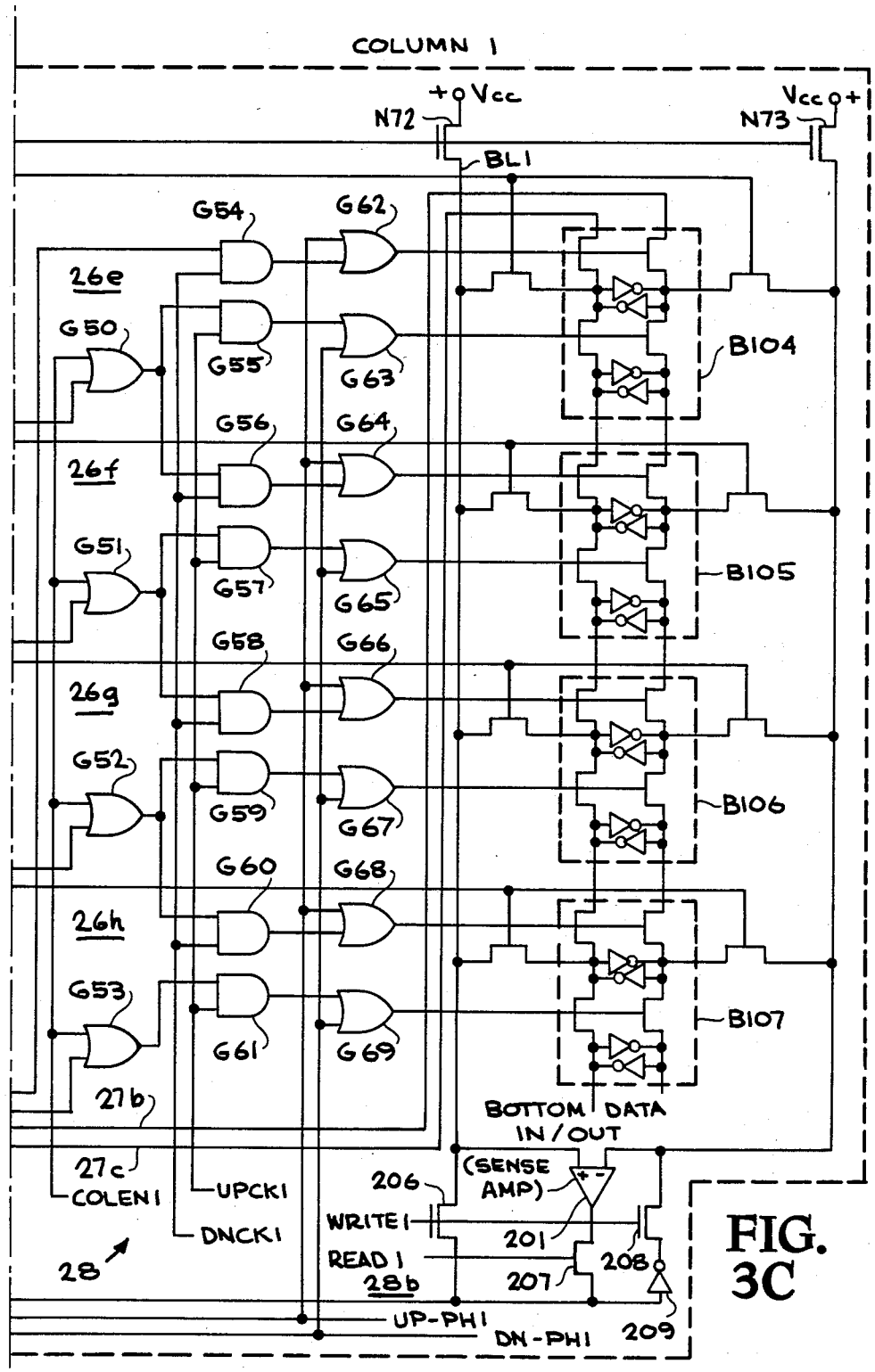

In order to facilitate the understanding of the operation and for purposes of discussion of the fracturable x-y array 10 of FIG. 2, there is illustrated in FIG. 3 a logic diagram of a much smaller x-y array 10a consisting of only eight-bits organized in four rows and two columns. The array 10a includes eight memory cells or bits B100, B101, ... B107 which are arranged in a matrix having the four rows and two columns. Each of the cells contain a pair of cross-coupled latches referred to as a master latch ML and a slave latch SL, and four shift enable N-channel MOS transistors SE1 through SE4 for shifting true and complementary data Q and $\overline{Q}$ of each cell between the master and slave latches of one cell and between the slave/master latch and master/slave latch of respective adjacent cells. The memory cells B100, B101, ... B107 are of an unique construction which will be described more fully hereinafter with respect to FIG. 7(b). A transfer gate T1 formed of an N-channel MOS transistor has its main terminals connected between the true data node Q of the cell B100 and a common bit sense line BL0. A transfer gate T2 formed of an N-channel MOS transistor has its main terminals connected between the complementary data node $\overline{Q}$ of the cell B100 and a common bit sense line $\overline{BL0}$. Similar transfer gates are connected in like manner in the remaining cells B101 through B107.

There are provided associated circuitry for use with the x-y array 10a which include a row decoder circuit 12, a Y-direction fracture circuit 22, a shift control driver circuit 26, and sense amplifier and read/write circuit 28. In addition, the associated circuitry includes a X-directional fracture circuit 32 in FIG. 5. The shift control driver circuit 26 consist of a plurality of drivers 26a through 26h for use with the respective memory cells B100, B101, . . . B107. The sense amplifier and read/write 28 includes an input/output circuit 28a for the column zero and an input/output circuit 28b for the column one.

The row decoder circuit 12 includes inverters I1, I2; AND logic gates G3, G4, G5, G6; and latches G7, G8, G9, G10. Row address signals A0 and A1 are applied to input lines 14 and 16 of the row decoder circuit 12, respectively. The input line 14 receiving the address bit A0 is connected to the input of the inverter I2, to one input of the AND gate G3, and to one input of the AND gate G5. The output of the inverter I2 is connected to one input of the gate G4 and to one input of the gate G6. The input line 16 receiving the address bit A1 is connected to the other inputs of the gate G3 and G4. The output of the inverter I1 is connected to the other inputs of the gates G5 and G6. The gates G3 through G6 serve to decode the row address bits A1, A0. For example, when the address=2 (A1, A0=10 binary) only the output of the gate G4 will be at a logic "1" or high level and the other gates G3, G5 and G6 will be at a logic "0" or low level. The output of the respective gates G3 to G6 are connected to a D-input terminal of the respective latches G7 through G10. The clock input terminals of the latches G7 through G10 are connected together and to a line 18 for receiving a first phase clock pulse signal PH1.

The respective true data output Q of the latches G7 through G10 are connected to one input of the respective AND gates G11 through G14 of the Y-direction fracture circuit 22. The other inputs of the gates G11 through G14 are connected together and to a line 20 for receiving a second phase clock pulse signal PH2. The latches G7 through G10 hold and maintain the outputs of the decoded row from the gates G3 through G6 so as to permit the row address bits A0 and A1 to change while random accessing and shifting of data operations occur in the array. The true and complementary data outputs Q and $\bar{Q}$ outputs of the latches G7 through G10 define the outputs of the row decoder circuit 12 which are connected to the inputs of the Y-direction fracture circuit 22.

The Y-direction fracture circuit 22 includes a chain of Y-fracture N-channel MOS transistors N19, N22, N25 and N28 which are connected in series. The drain of the transistor N19 is connected to the source of the transistor N22, and the drain of the transistor N22 is connected to the source of the transistor N25. The drain of the transistor N25 is connected to the source of the transistor N28. A shift down transistor N16 is connected to one end of the chain by the connection of its drain to the source of the transistor N19. The transistor N16 has its gate connected to a line 23 for receiving a shift down pulse signal and has its source connected to a ground potential. A shift up transistor N29 is connected to the other end of the chain by the connection of its drain to the drain of the transistor N28. The transistor N29 has its gate connected to a line 24 for receiving a shift up pulse signal and has its source connected to a ground potential.

The respective gates of the Y-fracture transistors N19, N22, N25 and N28 are connected to the respective complementary data outputs $\bar{Q}$ of the latches G7 through G10. A plurality of AND logic gates G11, G12, G13 and G14 has one of its inputs connected to the respective true data outputs Q of the latches G7 through G10. The outputs of the AND gates G11 through G14 provide row select signals RS0, RS1, . . . RS3 in which each one is connected to gates of the transfer gates T1 and T2 for all memory cells in the corresponding rows 0, 1, . . . 3.

Only one of the row select signals RS0 through RS3 will be at a high or "1" logic level when that particular row has been selected. This causes all of the memory cells in the selected row to be tied to the corresponding paired bit sense lines BL0, $\overline{BL0}$, BL1, $\overline{BL1}$. Precharging P-channel MOS transistors P17, P20, P23, and P26 have their sources connected to a supply voltage or potential VCC which typically is +5.0 volts. All of the gates of the precharging transistors are connected together and to the output of an inverter I15. The input of the inverter I15 is connected to the line 18. The inverters I27, I24, I21, I18 provide at their outputs partial shift enable signals PSE0 through PSE3. The respective inputs of the inerters I27, I24, I21 and I18 are connected to the corresponding sources of the respective precharging transistors P26, P23, P20 and P17.

The shift control driver circuit 26 having drivers 26(a)–(d) for the four bits B100, B101, B102 and B103 in column zero includes OR gates G30 through G33; AND G35 through G41; and OR gates G42 through G49. Similarly, the shift control driver circuit 26 having drivers 26(e)–(h) for the four bits B104, B105, B106 and B107 in column one includes OR gates G50 through G53; AND gates G54 through G61; and OR gates G62 through G69.

For the memory cell B100, the shift driver circuit 26a is formed by the gates G30, G35, G42 and G43. The OR gate 30 has a first input from the partial shift enable signal PSE0 for the row zero in the Y-direction fracture circuit 22 and a second input for receiving a column enable signal (COLEN0). The AND gate G35 has a first input connected to the output of the OR gate G30 and a second input for receiving a timing clock puse UPCK0. The OR gate G42 has a first input for receiving a timing pulse UP-PH1 and a second input for receiving a timing clock pulse DNCK0. The output of the gate G42 is connected to the gates of the shift enable transistors SE3 and SE4. The gate G43 has a first input connected to the output of the gate G35 and a second input for receiving a timing pulse DN-PH1. The output of the gate G43 is connected to the gates of the shift enable transistors SE1 and SE2.

The shift control driver circuit 26b for the memory cell B101 is formed by the gates G31, G36, G37, G44 and G45. The OR gate G31 has a first input from the partial shift enable signal PSE1 for the first row in the Y-direction fracture circuit 22 and a second input for receiving the column enable signal COLEN0. The gate G36 has a first input connected to the output of the gate G30 in the next lower cell B100 and a second input for receiving the timing clock pulse DNCK0. The gate G37 has a first input connected to the output of the gate G31 and a second input for receiving the timing clock pulse UPCK0. The gate G44 has a first input connected to the output of the gate G36 and a second input for receiving the timing pulse UP-PH1. The output of the gate G44 is connected to the gate of the shift enable transistors SE3 and SE4 in the cell B101. The gate G45 has a first input connected to the gate G37 and a second input for receiving the timing pulse DN-PH1. The output of the gate G45 is connected to the gates of the shift enable transistors SE1 and SE2 in the cell B101.

The remaining logic gates for the shift control driver circuits 26c through 26h for the respective cells B102 through B107 are interconnected in a corresponding manner to that just described relative to the logic gates for the memory cell B101. It is noted that the driver circuit 26a is the only one that has only one AND gate. This is because the cell B100 corresponding to the bit 0 will never have data shifted into it from a lower address. It should be understood to those skilled in the art that the single-bit memory cell B100 could be replaced by an eight-bit word of storage elements arranged in a horizontal row. In this case, the gates G42 and G43 would drive the eight bits in parallel. Similarly, the memory cells B101 through B107 could be connected in a likewise fashion. As a result, words rather than bits would then be connected in a series chain in each column so as to permit bidirectional shifting between corresponding bit locations of adjacent words. It will also be noted that the bottom of one column (column 0) and the top of the next column (column 1) are interconnected or linked by a shift line 27a and data lines 27b, 27c. This would be repeated for each of the columns in a given matrix.

The input/output circuit 28a for the column zero includes a sense amplifier 200; N-channel MOS transistors 202, 203, and 204; and an inverter 205. Similarly, the input/output circuit 28b for column one includes a sense amplifier 201; N-channel MOS transistors 206, 207, 208; and an inverter 209. The sense amplifier and read/write circuit 28 is quite conventional for typical RAM designs for read/write operations. For example, for column zero the sense amplifier 200 has its input connected to the paired bit sense lines BL0 and $\overline{BL0}$ and provides a data output signal on line 30 via the transistor 203. The transistor 203 is enabled by a read signal READ0. The write operation is controlled by the transistors 202 and 204 which are enabled by a write signal WRITE0 for feeding the data on the line 30 to the bit sense lines BL0 and $\overline{BL0}$. The bit sense lines BL0, $\overline{BL0}$, BL1, and $\overline{BL1}$ are connected to a supply voltage or potential VCC via respective precharged transistors N70 through N73. The gates of the transistors N70 through N73 are connected to the first phase pulse signal PH1 for precharging each pair of bit sense lines in each column.

Figure 4:
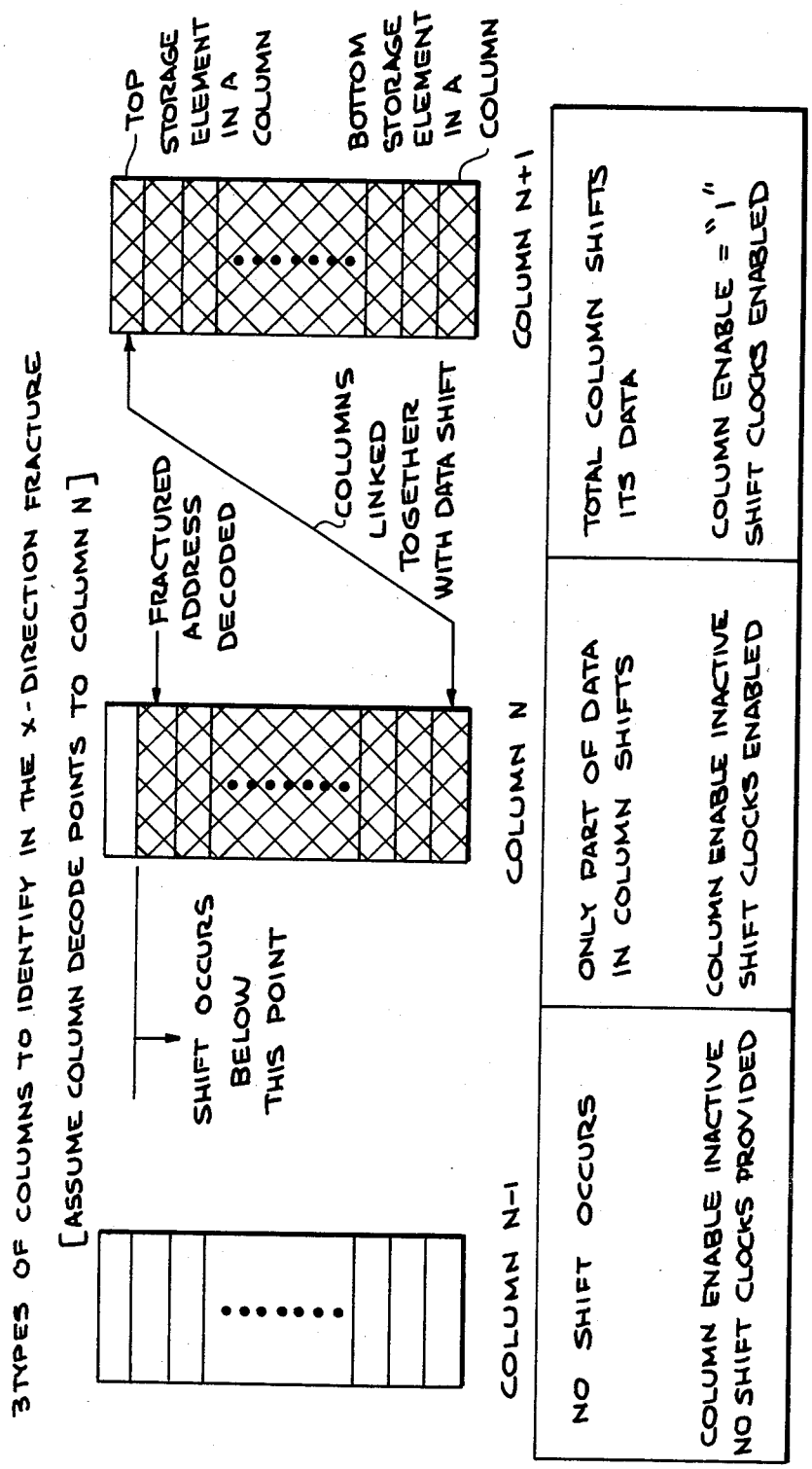
FIG. 4 is a simplified representation of the three basic type of columsn that are possible for the columns in FIG. 2.

As a background and to assist in understanding the invention, there is shown in FIG. 4 a simplified representation of the three basic types of columns that exist for a facture in the X-direction. The first type of columns is the fractured column (i.e., column No. N) in which only part of the data shifts. Specifically, all of the data in locations below a fractured address will be shifted and all of the data in location above the fracture address do not shift. The second type of column is, one in which no shifting of data occurs, (i.e., column No. N−1) whose column address is lower than the fractured column address. The third type of column is, one in which all of the data is shifted, (i.e., column No. N+1) whose column address is higher than the fractured column address.

For column column No. N, the column enable signal COLEN No. N will be inactive or at a logic "0" and the timing pulses UPCK No. N and DNCK No. N will be provided. For the column No. N−1, the column enable signal COLEN No. N−1 will be inactive or at a logic "0" and the timing pulses UPCK No. N−1 and DNCK No. N−1 will not be provided. For the column No. N+1, the column enable signal COLEN No. N+1 will be enable or at a logic "1" and the timing pulses UPCK No. N+1 and DNCK No. N+1 will be provided. A circuit for implementing this type of logic control is illustrated in FIG. 5.

Figure 5:
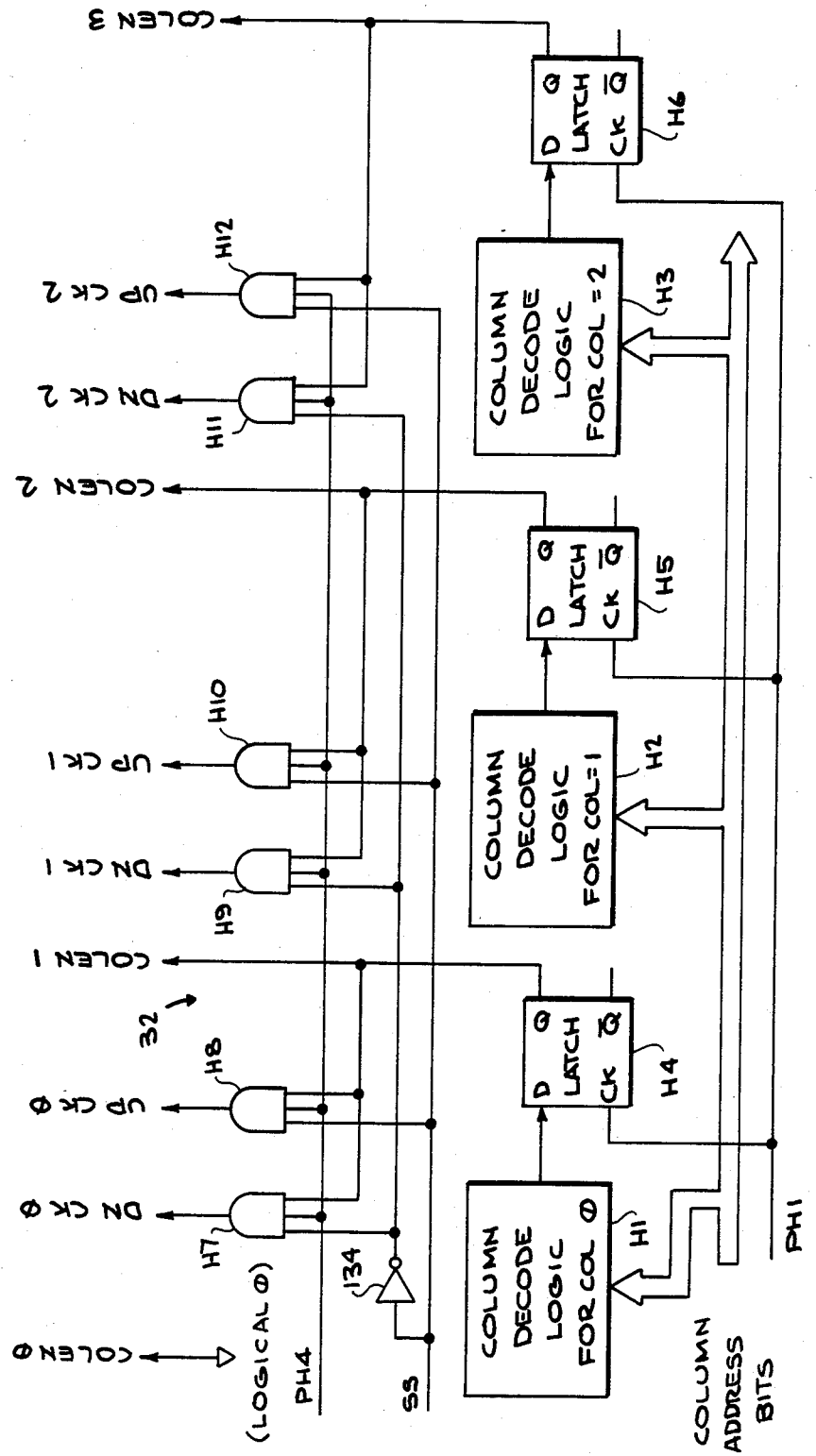
FIG. 5 is a block diagram of an X-direction fracture circuit for use in the memory array in FIG. 3.

FIG. 5 illustrates in block diagram form the X-direction fracture circuit 32 for generating the column enable signals COLEN0 and COLEN1 and the timing pulses UPCK0, DNCK0, UPCK1 and DNCK1 used in the logic gates in FIG. 2. The X-direction fracture circuit 32 includes logic blocks H1, H2 and H3 responsive to column address bits (i.e., A4, A3) for generating the column enable signals COLEN0, COLEN1 and COLEN2. The logic blocks H1 through H3 may be formed in a number of ways so as to produce column enable signals which are at a high or "1" logic level for the column address corresponding to the first column in which all the data is to be shifted and for all higher numbered columns. Thus, these signals are referred to as "total" column enable signals. One way in which these column enable signals could be produced is by a fracture chain similar to the one in the Y-direction fracture circuit 22.

The outputs of the logic blocks H1 through H3 are fed to respective latches H4 through H6 whose outputs are latched by the first phase clock pulse PH1 so as to allow the column address bits to change during the shifting operation in the array. As can be seen, the column decode logic block H1 for the column zero is used to generate the next higher column enable signal COLEN1. Similarly, the logic blocks H2 and H3 are used to generate the next higher column enable signals COLEN2 and COLEN3. The timing signals for column zero that actually cause the shift to occur are controlled by column shift gates H7 and H8 which are enabled by the next higher column enable signal COLEN1.

Similarly, the timing pulses for the column one are controlled by column shift gates H9 and H10 which are enabled by the column enable signal COLEN2. The timing pulses for the column two are controlled by column shift gates H11 and H12 which are enabled by the column enable signal COLEN3. Each of the gates H8, H10 and H12 receive two input signals consisting of a fourth phase pulse signal PH4 and a selection signal SS. Each of the gates H7, H9 and H11 receive two input signals consisting of the fourth phase pulse signal PH4 and the complement of the selection signal SS via an inverter I34. If a pop operation has been selected, the selection signal SS will be at a logic "1" when the fourth phase pulse signal occurs. On the other hand, if a push operation has been selected the selection signal SS will be at a logic "0" when the fourth phase pulse signal occurs.

The operation of the fracturable x-y array 10a with its associated circuit in FIGS. 3 and 5 will now be explained with reference to the waveforms of FIG. 6(a)–(s), which are useful in facilitating the understanding of a pop operation and a push operation. The graphic representation of FIGS. 6(a)–(s) illustrate the timing waveforms at various points in the circuits of FIGS. 3 and 5 for a pop operation at the decoded address=2 (i.e., A2, A1, A0=010 binary) which is followed immediately by a push operation at the decoded address=5 A2, A1, A0=101 binary).

Figure 6:
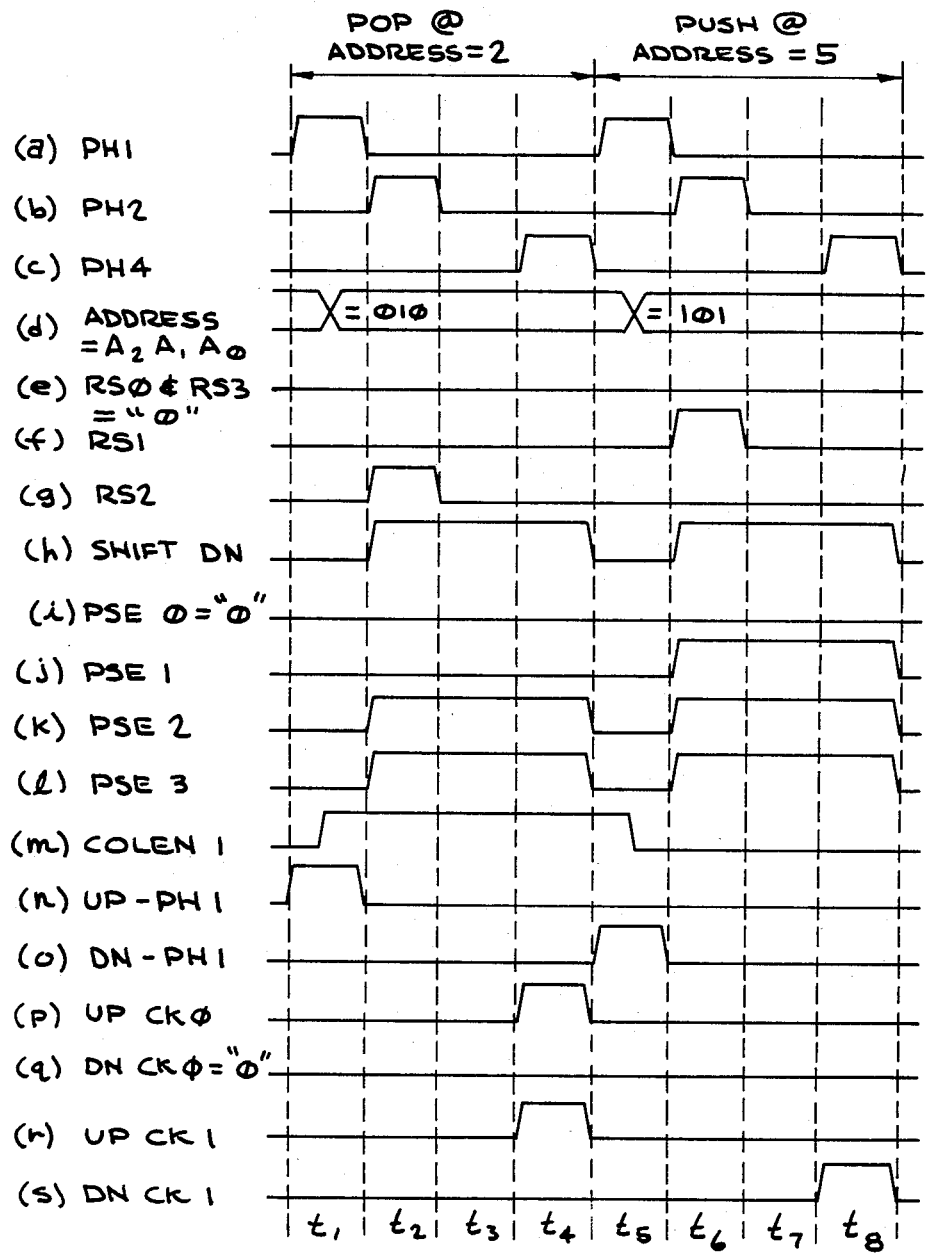
FIGS. 6(a)-(s) ae waveforms existing at various points in the circuits of FIG. 3 and 5 useful in understanding the operation thereof.

For the address=2 (FIG. 6(d)) at the time t1, only the output of the AND gate G4 will be at a logic "1". The outputs of the other gates G3, G5 and G6 will remain at a logic "0". Thus, the first phase clock pulse PH1 (FIG. 6a) at the time t1 will cause the paired bit sense lines BL0, BL0 and BL1 and BL1 to be precharged to the supply potential VCC since the transistors N70 through N73 will be rendered conductive. The data output Q of the latch G8 in the decoded row will be maintained at a logic "1" until the next first phase clock pulse PH1. Further, the intermediate nodes A through D in the Y-fracture chain are charged to a high value during the time t1 in preparation for the fracture selection in the Y-direction since the transistors P17, P20, P23, and P26 are rendered conductive.

As this precharging occurs, data in the master latches ML in the cells B103 through B107 are sampled by the slave latches SL in the memory cells above it due to the timing pulse UP-PH1 shown in FIG. 6(n) which is applied to the respective gates G48, G62, G64, G66 and G68. This causes the shift enable transistor SE3 and SE4 in the cells B103 through B107 to be turned on. By having the power connected to each slave latch SL turned off during the timing pulse UP-PH1 an upward shift will be caused in the cells B103 through B107. The timing pulse UP-PH1 is applied because the pop operation is to be performed. The pop operation requires the reading of data at a particular random address and the data in the next lower address is moved or popped up to fill that address. All data in the higher addresses are also shifted up to the next lower addresses.

At time t2, the second phase pulse signal PH2 (FIG. 6b) applied to the gate G12 causes its output to go to a high or logic "1" level. As a result, the row select signal RS2 (FIG. 6g) at the output of the AND gate G12, which is normally low, will be switched to a high or logic "1" level so as to turn on the transfer gates T1 and T2 in the second row. This, in turn, causes the true and complement outputs Q and $\overline{Q}$ in the cells B102 and B106 in the second row to be connected to their respective bit sense lines BL0, $\overline{BL0}$ and BL1, $\overline{BL1}$. By activating the transistor 203 at the time t2 with the signal READ0, the data in the memory cell B102 can be read on the line 30. This read signal is derived by decoding of the address bit A2.

At this time t2, there is also applied a shift down pulse signal of FIG. 6h to the gate of the transistor N16 via the line 23 which turns on the same so as to pull down all of the intermediate nodes (C and D) below the decoded row. Since the second row is the decoded row in this case, only the complementary data output $\overline{Q}$ of the latch G8 will be at a low potential so as to turn off the transistor N22. Thus, all intermediate nodes (nodes A and B) above the fracture point (RS2) will remain high so as to cause the partial shift enable signals PSE0 and PSES1 to be low, thereby disabling a shift in the zero and first rows in the column zero where the partial shift occurs (FIG. 6i and 6j). The column in which the partial shift occurs is determined by the logic blocks H1 through H3 in FIG. 5 which decode the column address bit A2. The column enable signal COLEN1 (FIG. 6m) will be high indicating that column one is to be shifted. Thus, the gate H7 and H8 for column zero will be enabled by this next higher column enable signal COLEN1.

It is to be noted that the transistor N16 is turned on to permit shifting only of data located in addresses higher than the fracture address. If it is desired to shift only data located in addresses lower than the fracture address, then the transistor N29 would be required to be turned on. By turning on the transistor N16 at the time t2, the nodes C and D will be discharged so as to cause the partial enable signal PSE2 and PSE3 to be high (FIGS. 6k and 6l). The signal PSE2 is applied via gate G32 to the gates G39 and G40. The signal PSE3 is applied via the gate G33 to the gates G41 and G54.

As can been seen from FIG. 5, the signal UPCK0 (FIG. 6p) from the gate H8 and UPCK1 (FIG. 6r) from the gate H10 will be generated in response to the fourth phase signal PH4 (FIG. 6c) since the selection signal SS will be high at the time t4 for a pop operation. These signals UPCK0 and UPCK1 are inputs to the gates G39, G41, G55, G57, G59 and G61 which are used to turn on the shift enabled transistors SE1 and SE2 in cells B102 through B107. The signals DNCK0 and DNCK1 will be low since the inverter I34 will prevent the fourth phase pulse signal PH4 from reaching the outputs of the gates H7 and H9. Thus, the outputs of the gates G38, G40, G54, G56, G58 and G60 will be low so as to turn off the shift enable transistors SE3 and SE4 in the cells B102, B103 and B14. As a result, by turning off the power to the master latches ML during application of the up-shift clock signals UPCK0 and UPCK1, data in the slaves SL in the cells B102 through B107 will be shifted up to the respective master latches ML. Since the total column enable signal COLEN1 is high, the signal UPCK1 applied to the gates G55, G57, G59 and G61 in column one will cause all data therein to be shifted up to the next lower address.

In summary, it will be noted that any column with its column shift gates enabled (i.e., gates H7 through H12) will be allowed to shift if either its total column enable (COLEN0 and COLEN1) is high or if the partial shift enable signal (outputs from the Y-direction fracture circuit 22) is high. In this way, the partial shift enable signals affect only shifting in the column in which the fracture occurs (i.e., column which only part of the data is shifted).

At time t5, the address is now changed to address=5 (A2, A1, A0=101 binary) in FIG. 6d so as to cause only the output of the gate G5 to be high. By application of the first phase pulse signal PH1 again (FIG. 6a), the output Q of the gate G9 will be latched in the high state. At the time t6, the output of the gate G13 will be the only one going high and the Y-direction fracture circuit 22 will function in the same way so as to cause the partial shift enable signal PSE1, PSE2 and PSE3 (FIGS. 6j, 6k, and 6l) to go high. This is due to the fact that the first row is now selected which provide the row select signal RS1 (FIG. 6f) to be high. The row select signal RS1 will cause data to be written into the master latch ML of the cell B105 via the input/output circuit 28b. Since the data located in addresses higher than the fracture addresses are to be shifted down to the next higher address for a push operation, a down shift signal DN-PH1 (FIG. 6(o)) is also initiated during the time t5 so as to cause all of the master latches ML in the cells B105 through B107 to be sampled by the slave latch SL below. The partial shift column is now column one due to the fact that the address=5.

The fourth phase pulse signal PH4 (FIG. 6c) at the time t8 is not applied to the cells in column zero because the gates H7 and H8 (FIG. 5) are disabled. Thus, no up-shift clock signal UPCK0 or down-shift clock signal DNCK0 (FIGS. 6p and 6q) will appear. It will be recalled, that any column with a column address lower than the partial shift column address will have a column enable signal which is low. Thus, the column enable signal COLEN1 will be low, thereby disabling the gates H7 and H8. However, at the time t8 the partial shift enable signals PSE1 through PSE3 will allow a downward shift to occur in the slave latches SL in the cells B105 through B107 to corresponding master latches in the next higher address. This is because the column shift gate H9 will provide down-shift clock signal DNCK1 (FIG. 6s) which is derived from the fourth phase pulse signal PH4. It will be noted the column enable signal COLEN2 will be high and the selection signal SS will be low at the time t4 for a push operation.

Figure 7A:
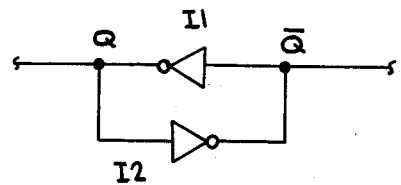
FIG. 7(a) is a logic diagram representative of a master latch or slave latch in the memory cell of the present invention.
Figure 7B:
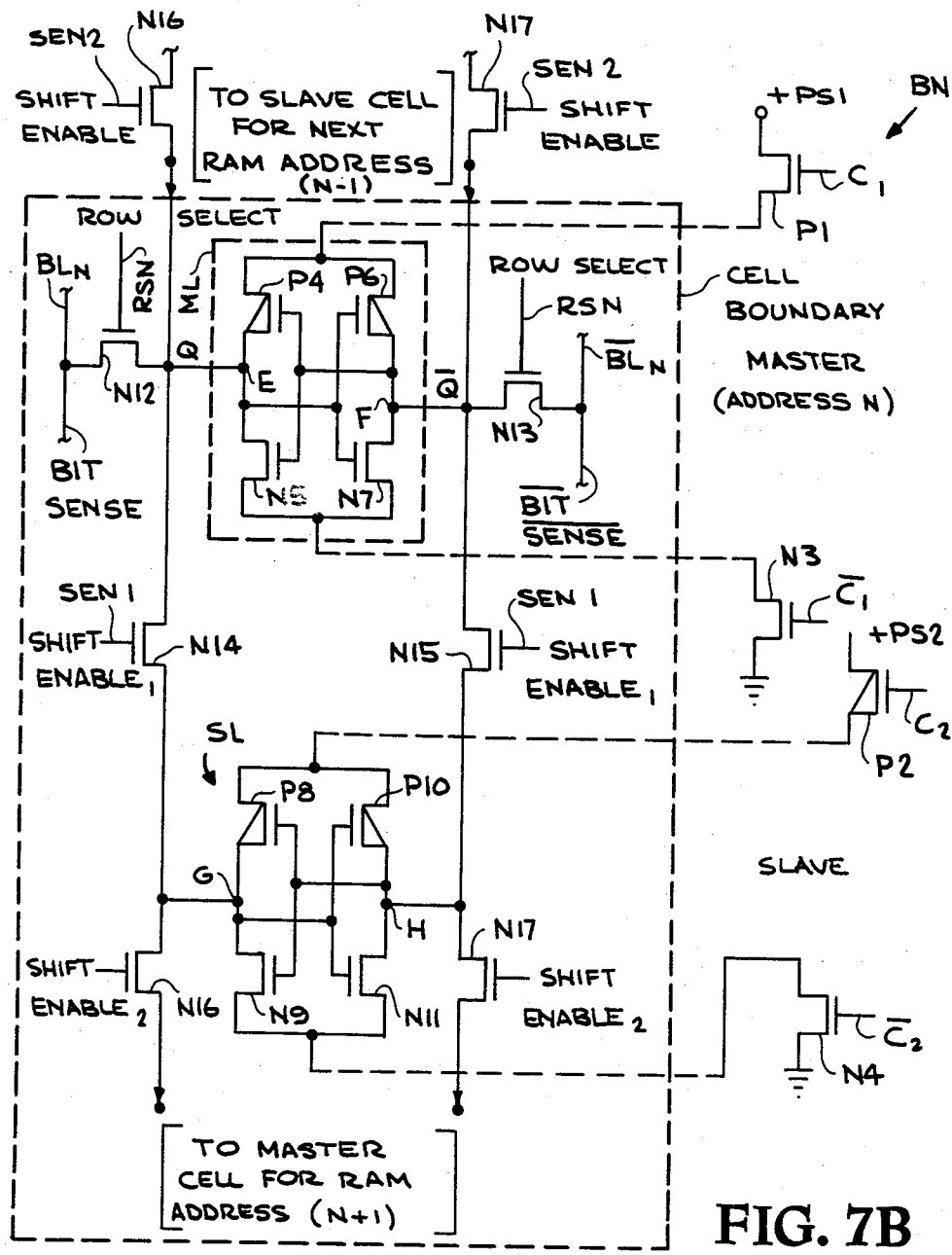
FIG. 7(b) is a detailed schematic circuit diagram of a single-bit random access memory cell of the present invention.

As was previously pointed out, each of the memory cells B100 through B107 of the present invention shown in FIG. 3 includes a pair of cross-coupled latches referred to as a master latch ML and a slave latch SL. In FIG. 7a, there is shown a logic representation of a latch circuit for use as either the master latch or the slave latch. The latch circuit is formed of a first inverter I1 and a second inverter I2. The inverter I1 has its output connected to the input of the second inverter I2 and provides the true data output Q. The inverter I2 has its output connected to the input of the first inverter I1 and provides the complementary data output $\overline{Q}$. The x-y array 10a of the present invention comprises a plurality of MOS static RAM cells, each cell having an arrangement identical to one another. Thus, each of the memory cells is constructed, as typically illustrated in detail in FIG. 7b of the memory cell BN. Since the memory cell BN shown in FIG. 7b is unique in its construction, it has applications other than for use in the fracturable x-y array of the present invention. For example, a plurality of such memory cells may be arranged in a column so as to function as a master/slave shift register with bidirectional shifting.

The master latch ML comprises a first inverter corresponding to the inverter I1 of FIG. 7a and a second inverter corresponding to the inverter I2. The first inverter in the master latch is formed of a P-channel MOS transistor P4 and a N-channel MOS transistor N5. The drains of the transistors P4 and N5 are connected together to form a node E defining the true data output Q. The gates of the transistors P4 and N5 are also connected together to form a node F defining the complementary data output $\overline{Q}$. The second inverter of the master latch ML is formed of a P-channel MOS transistor P6 and a N-channel MOS transistor N7. The drains of the transistors P6 and N7 are connected together and to the complementary data output $\overline{Q}$. The gates of the transistors P6 and N7 are also connected together and to the true data output Q. The sources of the transistors P4 and P6 are connected together and to a positive terminal of a first power supply PS1 via a power supply enabled transistor P1. The gate of the transistor P1 receives a first power supply true signal C1. The sources of the transistor N5 and N7 are connected together and to a ground terminal of the first power supply PS1 via a power supply enable transistor N3. The gate of the transistor N3 receives the complement of the first power supply true signal C1.

Similarly, the slave latch SL comprises a third inverter corresponding to the inverter I1 of FIG. 7a and a fourth inverter corresponding to the inverter I2. The third inverter is formed of a P-channel MOS transistor P8 and a N-channel MOS transistor N9. The fourth inverter is formed of a P-channel MOS transistor P10 and a N-channel MOS transistor N11. The drains of the transistors P8 and N9 are connected together and to a node G defining the true data output Q of the slave latch SL. The gates of the transistors P8 and N9 are also connected together and to a node H defining the complementary data output $\overline{Q}$ of the slave latch SL. The drains of the transistor P10 and N11 are connected together and to the complementary data output $\overline{Q}$ of the slave latch SL. The gates of the transistor P10 and N11 are also connected together and to the true data output Q of the slave latch SL. The sources of the transistors P8 and P10 are connected together and to a positive terminal of a second power supply PS2 via a power supply enable transistor P2. The gate of the transistor P2 receives a second power supply true signal C2. The sources of the transistors N9 and N11 are connected together and to the ground potential of the second power supply PS2 via a power supply enable transistor N4. The gate of the transistor N4 receives the complement of the second power supply true signal C2.

A row select transistor N12 has its main electrodes connected between the node E and the bit sense line BLN, and a row select transistor N13 has its main electrodes connected between the node F and the bit sense line $\overline{BLN}$. The gates of the row select transistors N12 and N13 receive a row select signal RSN which is from a row decoder circuit similar to the circuit 12 of FIG. 3. A first shift enable transistor N14 has its main electrodes connected between the nodes E and G. The gate of the transistor N14 receives a first shift enable signal SEN1. A second shift enable transistor N15 has its main electrodes connected between the nodes F and H. The gate of the transistor N15 receives also the first shift enable signal SEN1. A third shift enable transistor N16 is connected between the node E and a node corresponding to node G for the cell having the next lower address (cell BN−1). A fourth shift enable transistor N17 is connected between the node F and a node corresponding to the node H for the cell having the next lower address (cell BN−1). The gates of the transistors N16 and N17 receive a second shift enable signal SEN2.

If we assume the cell BN of FIG. 7b corresponds to the cell B102 in FIG. 3, then the transistor N12 corresponds to T1, and the transistor N13 corresponds to the transistor T2. The transistor N14 corresponds to the transistor SE1 and the transistor N15 corresponds to the transistor SE2. The transistor N16 corresponds to the transistor SE3, and the transistor N17 corresponds to the transistor SE4.

The operation of the RAM shift cell of FIG. 7b will now be explained with reference to the waveforms in FIGS. 8(a)–8(e) and 9(a)–(e). In particular, FIGS. 8(a)–(e) are timing diagrams for the RAM shift cell of FIG. 7(b) during a push operation. As can be seen, data is written into the memory cell at address=N at the time t2 since the row select signal RSN is high (FIG. 8e). This allows current to flow between the paired bit sense lines, BLN, and $\overline{BLN}$ and the nodes E, F. By applying a driving voltage on the bit sense line BLN and $\overline{BLN}$ through an input/output circuit similar to the circuit 28a of FIG. 3, data is written into the master latch ML.

During the time t1 before the write operation occurs, the second power supply signal C2 (FIG. 8b) will disable the slave latch SL by disconnecting the power supply terminals via the transistor P2 and N4. With the slave latch SL being disabled, it will be now permitted to receive data from one of the adjoining master latches ML (either above or below). Since its is desired to perform a push operation, the slave latch SL samples data from the master latch ML above. This is achieved by the shift enable signal SEN1 (FIG. 8c) applied to the gates of the transistors N14 and N15. During the time t4 after the write operation, the first power supply signal C1 (FIG. 8a) will disable the master latch by disconnecting the power supply terminals via the transistors P1 and N3. With the master latch ML being disabled, it will now be permitted to receive data from slave latch SL from the cell BN−1. This is achieved by the second shift enable signal SEN2 (FIG. 8d) applied to the gates of the transistors N16 and N17.

For a push operation, the second power supply signal C2 corresponds to the first phase 1 pulse signal PH1 shown in FIG. 6(a). The first power supply signal C1 corresponds to the fourth phase pulse signal PH4 shown in FIG. 6(c). The shift enable signal SEN1 corresponds to the timing pulse DN-PH1 in FIG. 6(o). The shift enable signal SEN2 corresponds to the down shift timing clock signal DNCK1 of FIG. 6(s).

In FIGS. 9(a)-(d), there are shown timing diagrams for the RAM shift cell of FIG. 7(b) during a pop operation. Data is read from the memory cell at address=N at the time t2 since the row select signal RSN is high (FIG. 9e). By not applying a driving voltage through an input/output circuit similar to the circuit 28a of FIG. 3 on the bit sense lines BLN and $\overline{BLN}$ which have been precharged at the time t1, data is read from the master latch ML via a read signal from an input/output circuit similar to the circuit 28a of FIG. 3.

During the time t1 prior to the read operation, the second power supply signal C2 (FIG. 9b) will disable the slave latch SL so as to receive data from one of the adjoining master latches ML. Since it is desired to perform a pop operation, the slave latch SL samples data from the master latch below it in the cell BN+1. This is accomplished by the second shift enable signal SEN2 (FIG. 9d) applied to the transistors N16 and N17. During the time t4 after the read operation, the first power supply signal C1 will disable the master latch ML so as to allow it to receive data from the slave latch SL below it. This is achieved by the first shift enable signal SEN1 (FIG. 9c) applied to the transistor N14 and N15.

For a pop operation, the second power supply signal C2 corresponds again to the first phase signal PH1 shown in FIG. 6(a). The first power supply signal C1 corresponds again to the fourth phase pulse signal PH4 shown in FIG. 6(c). The shift enable signal SEN2 corresponds to the timing pulse UP-PH1 in FIG. 6(n). The shift enable signal SEN1 corresponds to the up-shift timing clock signals UPCK1 of FIG. 6(r).

Figure 8:
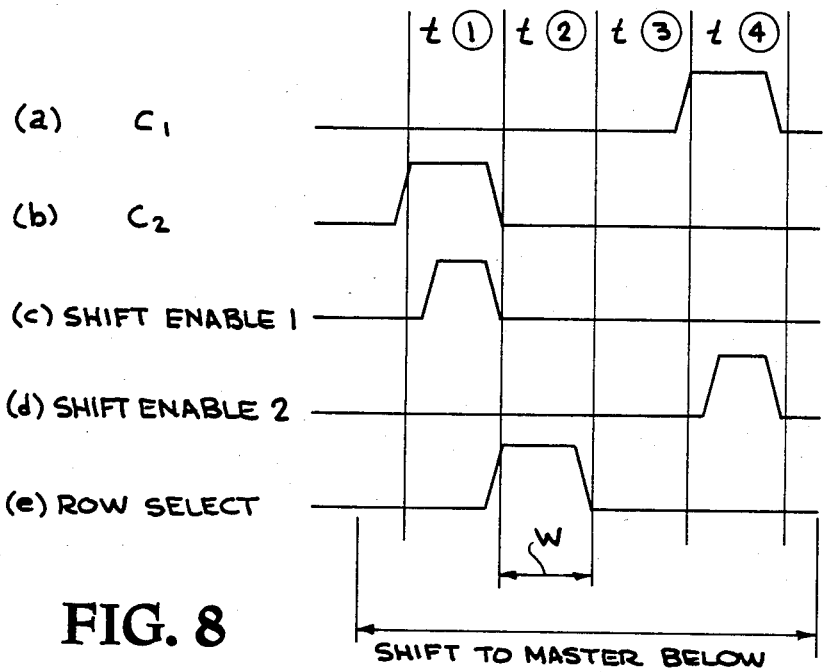
FIGS. 8(a)-(e) are waveforms useful in understanding the operation of the memory cell of FIG. 7(b) during a push operation.
Figure 9:
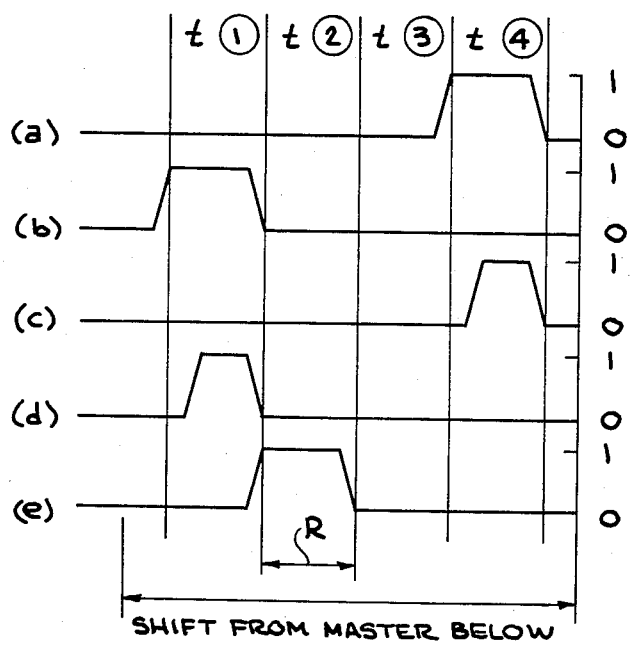
FIGS. 9(a)-(e) are waveforms useful in understanding the operation of the memory cell of FIG. 7(b) during a pop operation.

As can be seen from FIGS. 8 and 9, the power supplies for the master latch ML and the slave latch SL are turned off prior to the application of the respective shift enable signals SEN1 and SEN2 which are signals that go high. In this manner, the switching off and on of the power supplies to the master and slave latches are used to control the direction of the shift in a bidirectional shift, either in an upward or downward manner. Thus, the power supply is switched off to the latch which is to receive the data. Therefore, the driving RAM cell is only charging and discharging capacitance, thereby eliminating current consumption which would occur if both the pull-up and pull-down transistors in a CMOS inverter were both turned on. By driving both the true and complement sides (double-sided drive), this ensures that the gate voltages applied to the inputs of the cross-coupled latch are within one threshold of the power supplies before the positive power and ground terminals are connected. As a result, only a minimum amount of current is supplied by the switched power supplies when the power is reapplied to the receiving cell.

Figure 10:
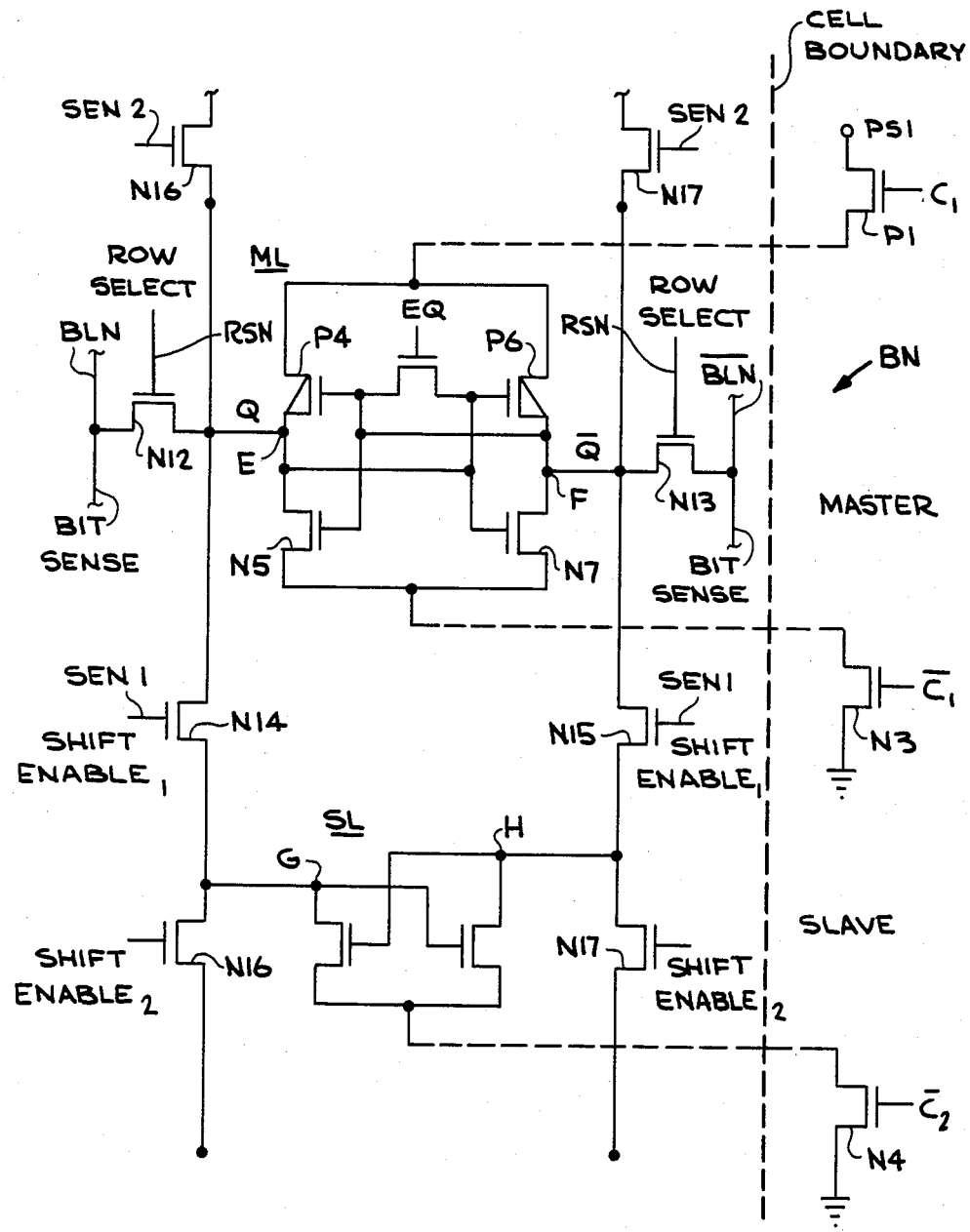
FIG. 10 is a detailed schematic circuit diagram of an alternate embodiment of a memory cell constructed in accordance with the present invention.

FIG. 10 illustrates an alternate embodiment of the static RAM cell of FIG. 7(b). In FIG. 10, the slave latch is replaced by a dynamic RAM cell which consists of only two transistors rather than four transistors. The static RAM cell for the master latch includes an equalizing transistor EQ which compensates for the balanced charge-sharing effect when the slave latch shifts data to the master latch. Except for these differences, the RAM cell of FIG. 10 is identical to the RAM cell of FIG. 7(b) and operates in an identical manner. Thus, the operation of the RAM cell in FIG. 10 will not be repeated again.

From the foregoing detailed description, it can thus be seen that the present invention provides an x-y array formed of a plurality of memory cells for random access of data and random fracturing of the array simultaneously by using a common address. Further, there is provided a memory cell formed of a pair of cross-coupled latches which includes means for controlling a bidirectional shift by switching off power to one of the pair of cross-coupled latches. In one particular application, a plurality of such memory cells are arranged in a column so as to function as a master-slave shift register with a bidirectional shift capability.

While there has been illustrated and described what are present to be considered preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope of thereof. Therefore, it is intended that this invention not be limited to the particular embodiments disclosed as the best modes contemplated for carrying out this invention, but that the invention will include all embodiments falling within the scope of the appended claims.

What is claimed is:

1. An x-y random access memory array for performing pushing and popping of data and for splitting the array simultaneously at a common address, comprising:
   a plurality of storage elements being stacked in a plurality of rows to form an x-y organization which can be randomly accessed in response to row and column addresses;
   row decoder means responsive to the row addresses for generating latched signals indicative of a selected row;
   row splitting circuit means responsive to said latched signals and a control shift signal for generating decoded row select signals to access the array in the Y-direction and for generating partial shift enable signals to split the array in the Y-direction at the selected row;
   column decoder means responsive to the column addresses for generating decoded column select signals to access the array in the X-direction;
   column splitting circuit means responsive to said decoded column select signals for generating column shift enable signals, first clock pulses, and second clock pulses to split the array in the X- direction at the selected column in which only part of the data shifts;

shift control driver circuit means responsive to said partial shift enable signals, said column shift enable signals, said first clock pulses, and said second column pulses for generating shift pulses;

said partial shift enable signals being activated only for rows with row addresses being one of higher and lower than the selected row address;

only storage elements located in the selected column being responsive to said partial select enable signals for causing a directional shift in which one of pushing data into and popping data from at any point in the selected column is performed;

said column shift enable signals, said first clock pulses, and said second clock pulses being disabled to said storage elements located in columns with column addresses being one of lower and higher than the selected columns so as to maintain their data unchanged; and said column shift enable signals, said first clock pulses, and said second clock pulses being enabled to storage elements located in columns with column addresses being the other one of higher and lower than the selected column so as to shift their data.

2. A memory array as claimed in claim 1, wherein each of said storage elements includes a single-bit memory cell, each memory cell being formed of a pair of cross-coupled latches.

3. A memory array as claimed in claim 1, wherein each of said storage elements includes a plurality of single-bit memory cells to define a data byte, each memory cell being formed of a cross-coupled master latch and a cross-coupled slave latch.

4. A memory cell as claimed in claim 3, further comprising means for switching on and off a power supply connected to said master latches to control the direction in which the bidirectional shift occurs.

5. A memory cell as claimed in claim 4, wherein said master latches sample data from one of the adjoining slave latches when the power supply connected to said master latches is switched off.

* * * * *